(12) United States Patent
Fujiwara et al.

(10) Patent No.: US 11,090,694 B2
(45) Date of Patent: Aug. 17, 2021

(54) TESTING APPARATUS

(71) Applicant: TOSHIBA MEMORY CORPORATION, Minato-ku (JP)

(72) Inventors: Tomoko Fujiwara, Fujisawa (JP); Takao Sueyama, Yokohama (JP); Keiko Kaneda, Chiba (JP); Michiko Tsumura, Shinagawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 231 days.

(21) Appl. No.: 16/298,141

(22) Filed: Mar. 11, 2019

(65) Prior Publication Data

US 2020/0030856 A1 Jan. 30, 2020

(30) Foreign Application Priority Data

Jul. 27, 2018 (JP) .............................. JP2018-141446

(51) Int. Cl.
*B08B 3/12* (2006.01)
*B08B 5/02* (2006.01)
*B08B 6/00* (2006.01)
*G01R 1/04* (2006.01)

(52) U.S. Cl.
CPC .................. *B08B 3/12* (2013.01); *B08B 5/02* (2013.01); *B08B 6/00* (2013.01); *G01R 1/0408* (2013.01)

(58) Field of Classification Search
CPC .... B08B 3/12; B08B 5/02; B08B 6/00; G01R 1/0408; G01R 31/2863; G01R 3/00; G01R 1/07314; G01R 1/06711

USPC ....................................................... 324/750.19
See application file for complete search history.

(56) References Cited

U.S. PATENT DOCUMENTS

| | | | | |
|---|---|---|---|---|
| 5,778,485 A | * | 7/1998 | Sano | B08B 1/00 15/301 |
| 6,474,350 B1 | * | 11/2002 | Mizuta | C11D 7/08 134/56 R |
| 2003/0200989 A1 | * | 10/2003 | Humphrey | B08B 7/0028 134/2 |
| 2007/0199583 A1 | * | 8/2007 | Choi | H01L 21/67253 134/94.1 |
| 2013/0130593 A1 | * | 5/2013 | Kalenian | B24B 49/04 451/5 |
| 2018/0330973 A1 | * | 11/2018 | Wu | H01L 22/20 |

FOREIGN PATENT DOCUMENTS

| | | |
|---|---|---|
| CN | 202256598 U | 5/2012 |
| JP | 11-230989 | 8/1999 |
| JP | 2007-120961 | 5/2007 |
| JP | 2007-163159 | 6/2007 |
| JP | 2010-101662 | 5/2010 |

* cited by examiner

*Primary Examiner* — Farhana A Hoque
(74) *Attorney, Agent, or Firm* — Oblon, McClelland, Maier & Neustadt, L.L.P.

(57) ABSTRACT

A testing apparatus according to an embodiment includes a chamber, a probe card including probes exposed in the chamber, a stage supporting a test target object in the chamber, a moving mechanism to move the stage between a testing position where the test target object is in contact with the probes and a cleaning position where the test target object is arranged away from the probes in a horizontal direction, and an air tube introducing first dry air into the chamber through the probe card when the stage is placed at the cleaning position.

16 Claims, 10 Drawing Sheets

TESTING APPARATUS

CROSS-REFERENCE TO RELATED APPLICATIONS

This application is based upon and claims the benefit of priority from Japanese Patent Application No. 2018-141446, filed on Jul. 27, 2018; the entire contents of which are incorporated herein by reference.

FIELD

The embodiments of the present invention relate to a testing apparatus.

BACKGROUND

There is known a technique of testing electrical characteristics of a semiconductor wafer while a probe (a needle) of a probe card is in contact with a metallic pad formed on the semiconductor wafer. When this test is repeated, metal scrap may adhere to the probe. In this case, there is a risk of reduction in the test accuracy and therefore the probe is periodically cleaned with a cleaning sheet.

When cleaned with a cleaning sheet, the probe is polished and wears out. Accordingly, the life of the probe may be shortened.

DETAILED DESCRIPTION

Embodiments will now be explained with reference to the accompanying drawings. The present invention is not limited to the embodiments.

A testing apparatus according to the present embodiment comprises a chamber, a probe card including probes exposed in the chamber, a stage supporting a test target object in the chamber, a moving mechanism to move the stage between a testing position where the test target object is in contact with the probes and a cleaning position where the test target object is arranged away from the probes in a horizontal direction, and an air tube introducing first dry air into the chamber through the probe card when the stage is placed at the cleaning position.

First Embodiment

Figure 1:
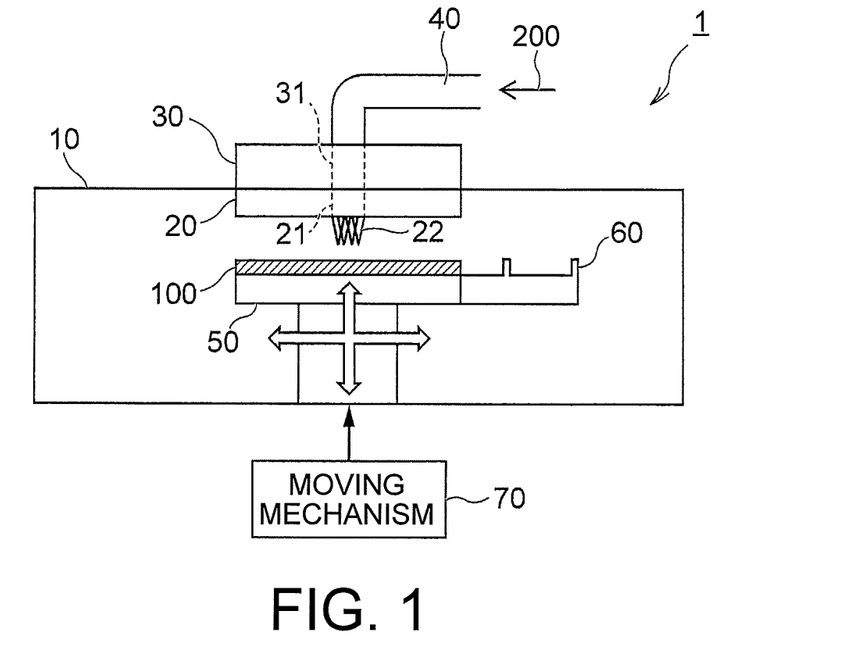
FIG. 1 is a schematic diagram illustrating a general configuration of a testing apparatus according to a first embodiment.

FIG. 1 is a schematic diagram illustrating a general configuration of a testing apparatus according to a first embodiment. A testing apparatus 1 illustrated in FIG. 1 includes a chamber 10, a probe card 20, a test head 30, an air tube 40, a stage 50, a scrap receiving member 60, and a moving mechanism 70.

The chamber 10 accommodates therein the probe card 20, the stage 50, and the scrap receiving member 60. In the present embodiment, a test target object 100 is tested in the chamber 10 under various temperature conditions. The test target object 100 is, for example, a semiconductor wafer. A metallic pad (not illustrated) is formed on the surface of the semiconductor wafer. The metallic pad is formed of, for example, aluminum.

Figure 2:
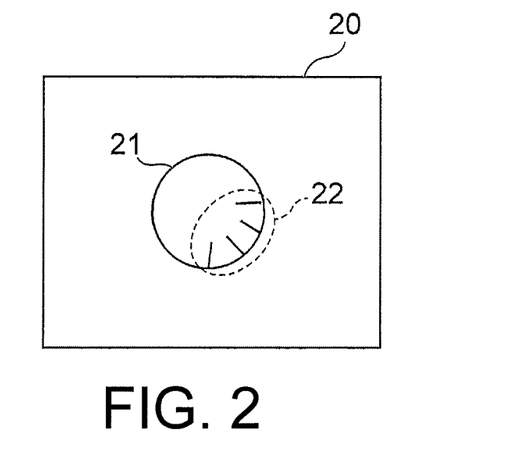
FIG. 2 is a schematic plan view of a probe card.

The probe card 20 is fixed to a top part of the inner surface of the chamber 10. An opening 21 is formed on the probe card 20. As illustrated in FIG. 2, a plurality of probes 22 are provided to be arranged along the opening 21. When viewed from above, leading ends of the probes 22 are arranged in the opening 21. The probes 22 are exposed in the chamber 10 to be capable of coming in contact with the metallic pad.

The test head 30 is electrically connected to the probe card 20 on a top part of the outer surface of the chamber 10. The test head 30 transmits or receives a signal to/from the probes according to an electrical condition related to a test of the test target object 100. An opening 31 is formed on the test head 30. The opening 31 communicates with the opening 21 formed on the probe card 20.

The air tube 40 introduces dry air 200 (first dry air) into the chamber 10 through the opening 31 of the test head 30 and the opening 21 of the probe card 20. The dew point of the dry air 200 is, for example, −60° C. to −70° C. The dry air 200 is used to blow down metal scrap (in the present embodiment, aluminum scrap) having adhered to the probes 22.

The stage 50 supports the test target object 100. The stage 50 can be moved horizontally and vertically by the moving mechanism 70.

The scrap receiving member 60 is provided integrally with the stage 50. Specifically, the scrap receiving member 60 protrudes horizontally from an outer circumferential part of the stage 50. The scrap receiving member 60 is formed in a concave shape. Metal scrap blown down from the probes 22 by the dry air 200 is recovered in the scrap receiving member 60.

The moving mechanism 70 adjusts positions of the stage 50 and the scrap receiving member 60 depending on a testing time of the test target object 100 and a cleaning time of the probes 22. The moving mechanism 70 has a motor for driving the stage 50 and the scrap receiving member 60, a drive circuit for the motor, and the like.

Figure 3A:
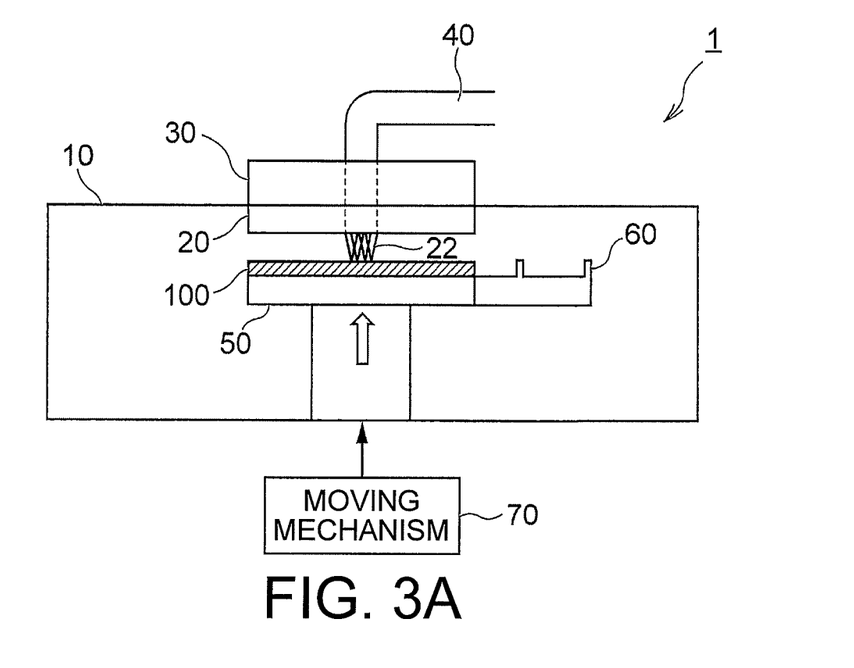
FIG. 3A is a schematic diagram illustrating a testing state using the testing apparatus according to the first embodiment.
Figure 3B:
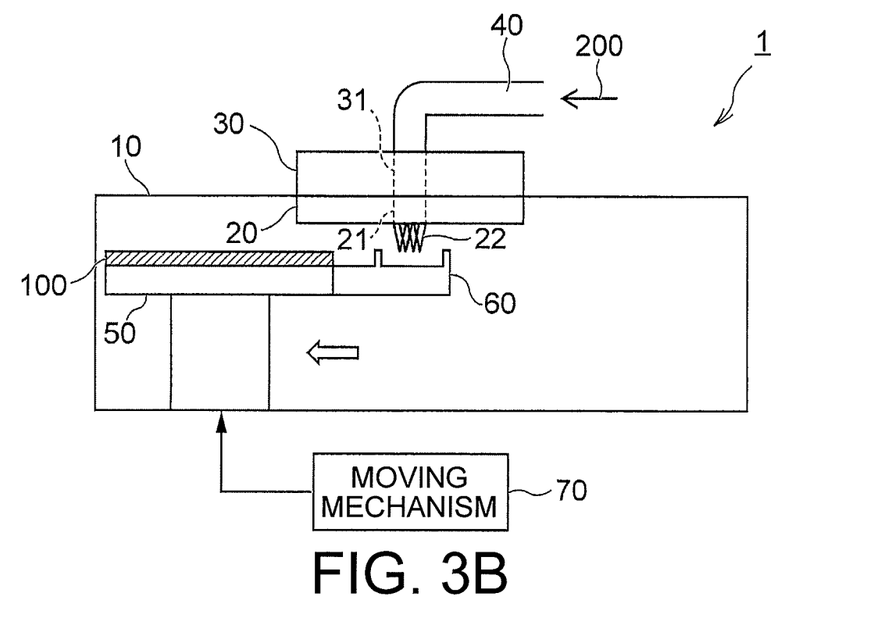
FIG. 3B is a schematic diagram illustrating a cleaning state using the testing apparatus of FIG. 3A.

FIG. 3A is a schematic diagram illustrating a testing state of the test target object 100. FIG. 3B is a schematic diagram illustrating a cleaning state of the probes 22.

When the test target object 100 is to be tested, the moving mechanism 70 vertically moves the stage 50 to a testing position as illustrated in FIG. 3A. At the testing position, the metallic pad (not illustrated) of the test target object 100 supported on the stage 50 is in contact with the probes 22. The test head 30 energizes the test target object 100 through the probes 22 in a state where the metallic pad is in contact with the probes 22. In this way, electrical characteristics of the test target object 100 are tested.

When the test described above is repeated, metal of the metallic pad may adhere as metal scrap to the probes 22. Therefore, in the present embodiment, the moving mechanism 70 horizontally moves the stage 50 to the cleaning position each time the test of the test target object 100 ends or periodically. At the cleaning position, the test target object 100 supported on the stage 50 is away from the probes 22 in the horizontal direction while the scrap receiving member 60 is placed below the probes 22.

Subsequently, the dry air 200 passes the opening 31 of the test head 30 from the air tube 40. Further, the dry air 200 flows into the chamber 10 from the opening 21 of the probe card 20. Because the probes 22 are provided along the opening 21, metal scrap having adhered to the probes 22 is blown down by the dry air 200. The metal scrap blown down is recovered by the scrap receiving member 60 arranged just below the probes 22.

According to the present embodiment explained above, metal scrap having adhered to the probes 22 is removed by the dry air 200. Therefore, the metal scrap can be removed without contact of a cleaning member such as a cleaning sheet with the probes, and the test accuracy of the test target object 100 can be maintained. Furthermore, because wear of the probes 22 at the time of cleaning can be prevented, reduction in the life of the probes 22 can be avoided.

First Modification

A first modification is explained. Constituent elements identical to those of the first embodiment described above are denoted by like reference characters and detailed explanations thereof are omitted.

Figure 4A:
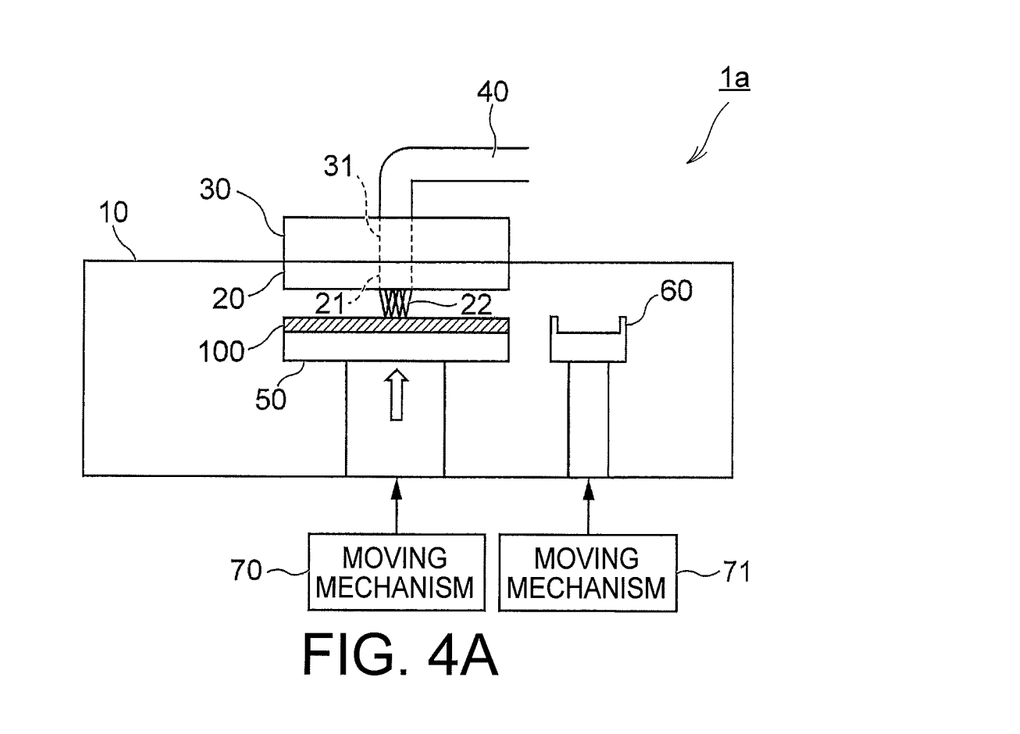
FIG. 4A is a schematic diagram illustrating a testing state using a testing apparatus according to a first modification.
Figure 4B:
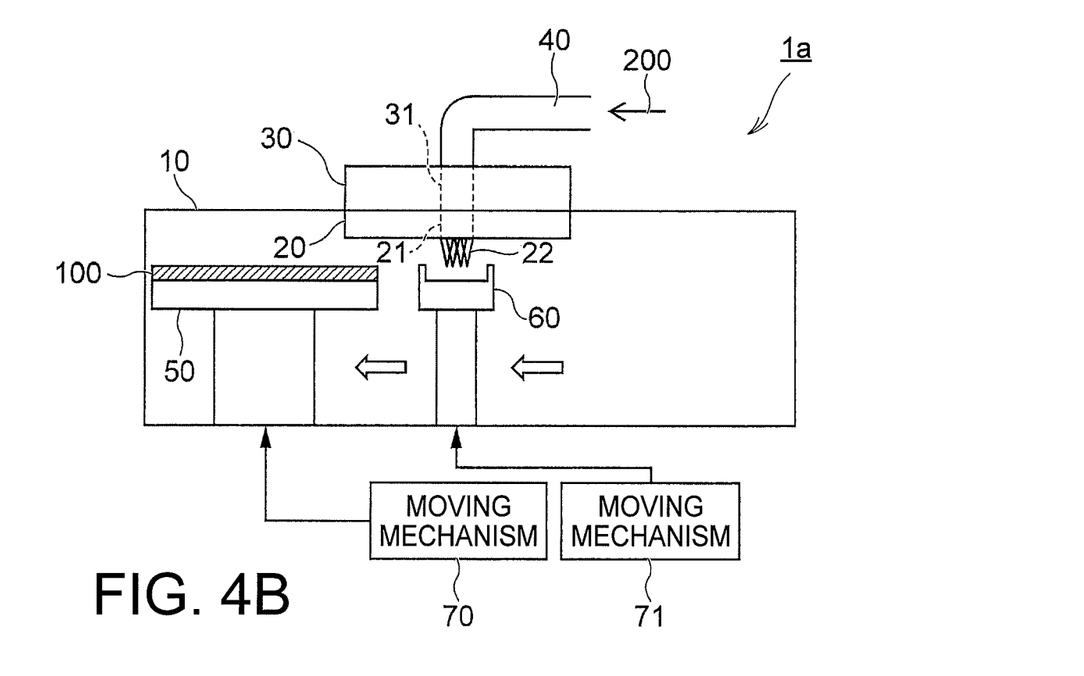
FIG. 4B is a schematic diagram illustrating a cleaning state using the testing apparatus of FIG. 4A.

FIG. 4A is a schematic diagram illustrating a testing state of the test target object 100 using a testing apparatus 1a according to the first modification. FIG. 4B is a schematic diagram illustrating a cleaning state of the probes 22 using the testing apparatus 1a.

As illustrated in FIGS. 4A and 4B, the scrap receiving member 60 is provided away from the stage 50 in the testing apparatus 1a according to the present modification. The moving mechanism 70 moves the stage 50 singly and a moving mechanism 71 moves the scrap receiving member 60 singly. That is, the stage 50 and the scrap receiving member 60 can move independently of each other.

In the present modification, when the test target object 100 is to be tested, the moving mechanism 70 moves the stage 50 upward to bring the test target object 100 into contact with the probes 22 as illustrated in FIG. 4A.

Meanwhile, when the probes 22 are to be cleaned, the moving mechanism 70 horizontally moves the stage 50 to arrange the test target object 100 away from the probes 22 in the horizontal direction as illustrated in FIG. 4B. The moving mechanism 71 moves the scrap receiving member 60 to below the probes 22. When the dry air 200 is thereafter introduced from the air tube 40 into the chamber 10, metal scrap having adhered to the probes 22 is blown down.

According to the present modification explained above, metal scrap having adhered to the probes 22 can be removed by the dry air 200 similarly to the first embodiment. Therefore, reduction in the life of the probes 22 can be avoided while the test accuracy of the test target object 100 is maintained.

Furthermore, the stage 50 that supports the test target object 100 and the scrap receiving member 60 can move independently of each other in the present modification. Therefore, respective positions of the test target object 100 and the scrap receiving member 60 can be easily adjusted.

Second Modification

Figure 5A:
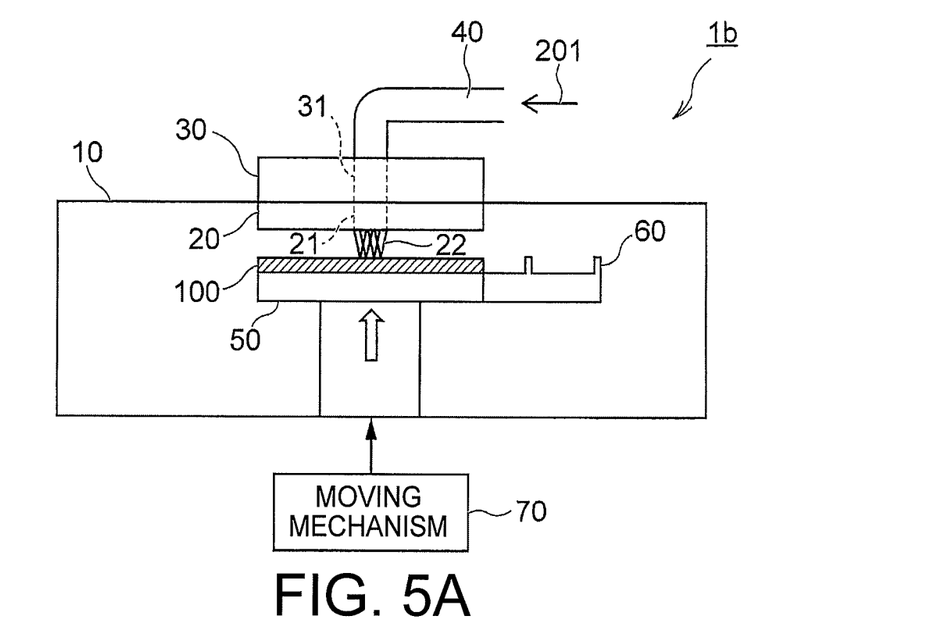
FIG. 5A is a schematic diagram illustrating a testing state using a testing apparatus according to a second modification.
Figure 5B:
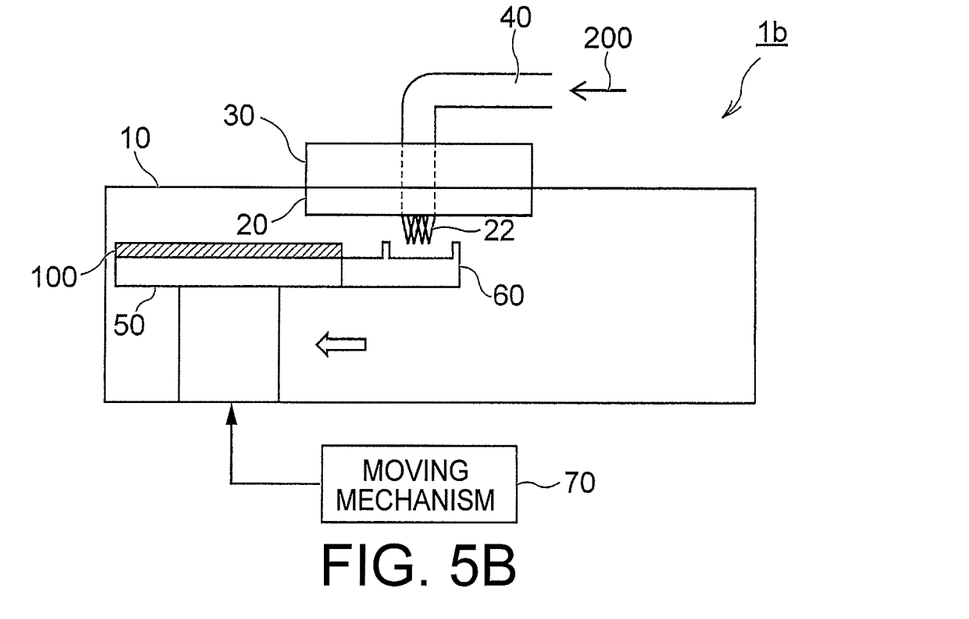
FIG. 5B is a schematic diagram illustrating a cleaning state using the testing apparatus of FIG. 5A.

FIG. 5A is a schematic diagram illustrating a testing state of the test target object 100 using a testing apparatus 1b according to a second modification. FIG. 5B is a schematic diagram illustrating a cleaning state of the probes 22 using the testing apparatus 1b.

While the testing apparatus 1b according to the present modification has an identical configuration to that in the first embodiment described above as illustrated in FIGS. 5A and 5B, the moving mechanism 70 and the moving mechanism 71 may be included similarly to the first modification described above. In this case, the stage 50 that supports the test target object 100 and the scrap receiving member 60 can be moved independently of each other.

In the present modification, dry air 201 (second dry air) is introduced from the air tube 40 into the chamber 10 through the test head 30 and the probe card 20 during a test of the test target object 100 as illustrated in FIG. 5A. In other words, the dry air 201 is introduced into the chamber 10 through the same flow channel as that of the dry air 200.

When the test temperature of the test target object 100, that is, the internal temperature of the chamber 10 is a low temperature such as −40° C., there is a possibility that moisture on the top surface of the probe card 20 produces condensation. When the internal temperature of the chamber 10 is a high temperature such as 150° C. to 200° C., the probes 22 may expand and misalignment with respect to the test target object 100 may arise.

However, when the dry air 201 is introduced into the chamber 10 during a low-temperature test as in the present modification, condensation can be avoided. When the dry air 201 is introduced into the chamber 10 during a high-temperature test, increase in the temperature of the probes 22 can be suppressed to reduce the misalignment described above. Furthermore, when the flow rate of the dry air 201 during testing is set to be smaller than the flow rate of the dry air 200 used during cleaning, a configuration where metal scrap is not blown down during testing but is blown down during cleaning can be achieved.

Third Modification

Figure 6:
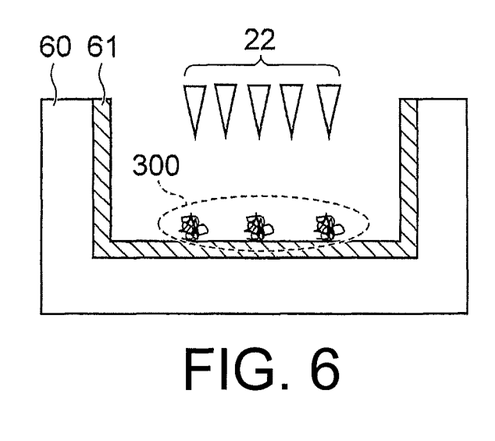
FIG. 6 is a schematic diagram illustrating a simplified configuration of a scrap receiving member according to a third modification.

FIG. 6 is a schematic diagram illustrating a simplified configuration of the scrap receiving member 60 according to a third modification. Configurations other than that of the scrap receiving member 60 are identical to those of the first embodiment or the first and second modifications, and therefore detailed explanations thereof are omitted.

In the present modification, an adhesive sheet 61 is provided on the surface of the scrap receiving member 60 as illustrated in FIG. 6. The adhesive sheet 61 contains an adhesive capable of adhering to metal. When the scrap receiving member 60 is placed at the cleaning position, the adhesive sheet 61 faces the probes 22.

Accordingly, when the dry air 200 is introduced from the air tube 40 into the chamber 10 during cleaning of the probe 22, metal scrap 300 blown down from the probes 22 is fixed to the adhesive sheet 61. This can prevent the metal scrap 300 from scattering in the chamber 10.

Second Embodiment

Figure 7A:
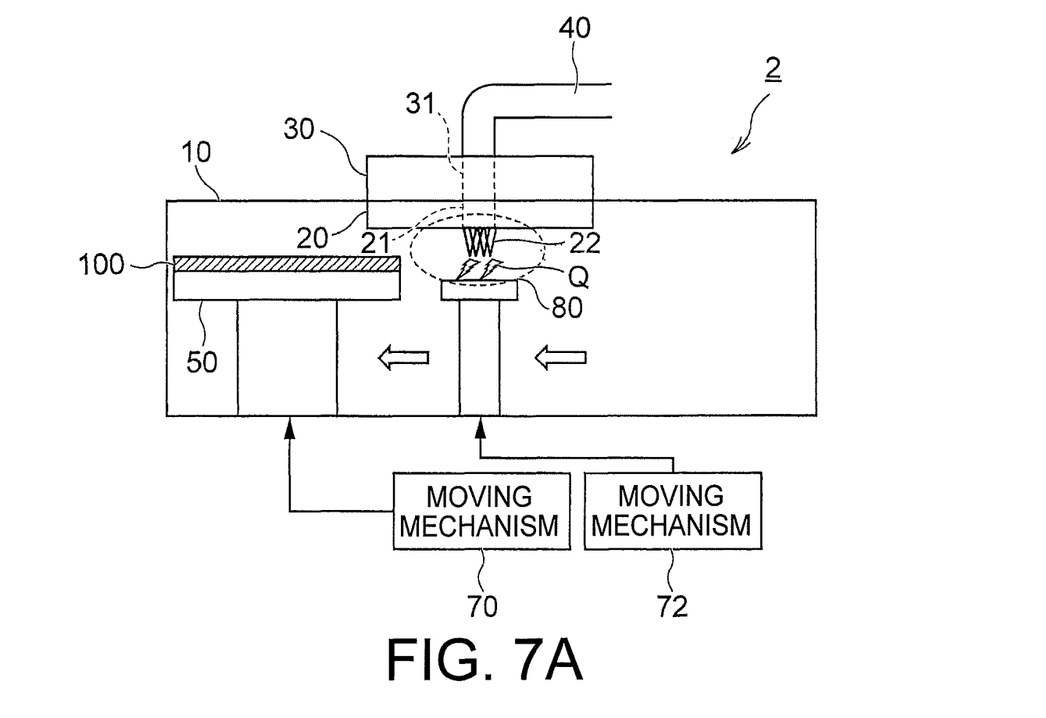
FIG. 7A is a schematic diagram illustrating a general configuration of a testing apparatus according to a second embodiment.
Figure 7B:
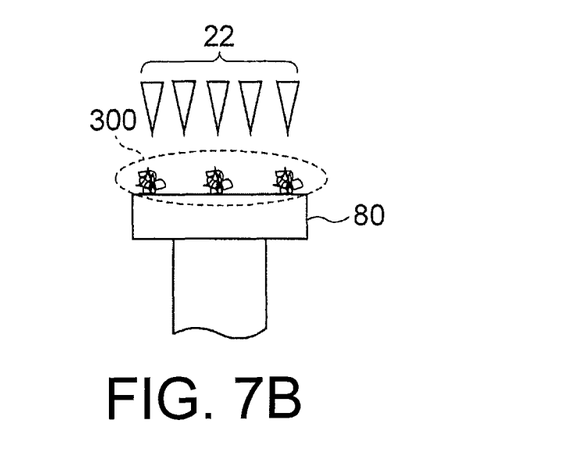
FIG. 7B is an enlarged view of a dotted line region illustrated in FIG. 7A.

FIG. 7A is a schematic diagram illustrating a general configuration of a testing apparatus according to a second embodiment. FIG. 7B is an enlarged view of a dotted line region illustrated in FIG. 7A. Constituent elements identical to those of the first embodiment described above are denoted by like reference characters and detailed explanations thereof are omitted.

A testing apparatus 2 according to the present embodiment is different from the testing apparatus 1 according to the first embodiment in including a moving mechanism 72 and a static electricity generator 80. The moving mechanism 72 can move the static electricity generator 80 horizontally and vertically.

When the test target object 100 is to be tested, the moving mechanism 70 moves the stage 50 upward to a testing position where the test target object 100 comes in contact with the probes 22. Meanwhile, when the probes 22 are to be cleaned, the moving mechanism 70 moves the stage 50 horizontally to arrange the test target object 100 away from the probes 22 in the horizontal direction as illustrated in FIG. 7A. The moving mechanism 72 horizontally moves the static electricity generator 80 to below the probes 22.

The static electricity generator 80 outputs a high voltage when placed below the probes 22 in a state not in contact with the probes 22. Accordingly, static electricity Q is generated between the static electricity generator 80 and the probes 22. As a result, the metal scrap 300 having adhered to the probes 22 is attracted to the static electricity generator 80 as illustrated in FIG. 7B. After cleaning, the test head 30 applies a voltage of 0 volt to the probes 22 to discharge the probes 22.

According to the present embodiment explained above, the metal scrap 300 having adhered to the probes 22 is removed by the static electricity Q generated by the static electricity generator 80. Accordingly, the metal scrap 300 can be removed without contact of a cleaning member such as a cleaning sheet with the probes 22. This can prevent wear of the probes 22 during cleaning and thus reduction in the life of the probes 22 can be avoided while the test accuracy of the test target object 100 is maintained.

In the present embodiment, the dry air 200 explained in the first embodiment may also be used as well as the static electricity Q of the static electricity generator 80 to remove the metal scrap 300 when the probes 22 are to be cleaned. In this case, the effect of removing the metal scrap 300 can be enhanced.

Fourth Modification

Figure 8A:
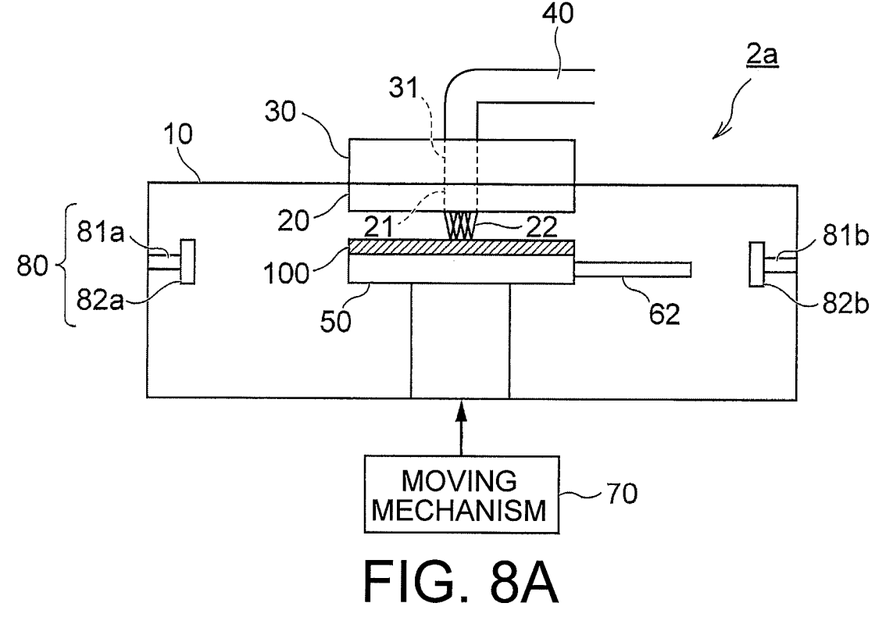
FIG. 8A is a schematic diagram illustrating a testing state using a testing apparatus according to a fourth modification.
Figure 8B:
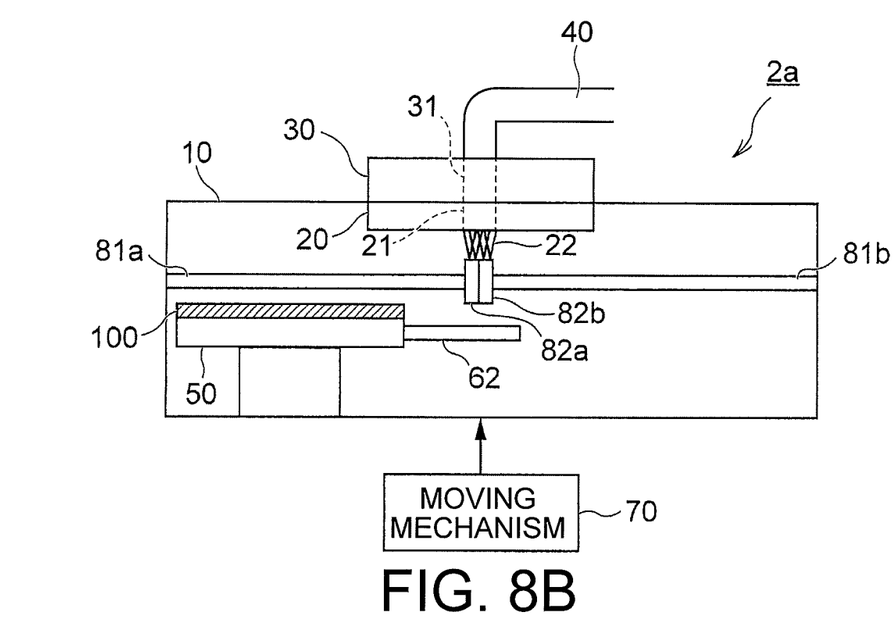
FIG. 8B is a schematic diagram illustrating a preparatory state of cleaning using the testing apparatus of FIG. 8A.

FIG. 8A is a schematic diagram illustrating a testing state of the test target object 100 using a testing apparatus 2a according to a fourth modification. FIG. 8B is a schematic diagram illustrating a preparatory state before the probes 22 are cleaned using the testing apparatus 2a.

The testing apparatus 2a according to the present modification is different from the testing apparatus 2 according to the second embodiment in including a scrap receiving member 62 and in the configuration of the static electricity generator 80 as illustrated in FIGS. 8A and 8B. The scrap receiving member 62 is provided integrally with the stage 50. The adhesive sheet 61 illustrated in FIG. 6 may be attached on the top surface of the scrap receiving member 62.

The static electricity generator 80 according to the present modification includes a pair of extensible members 81a and 81b, and a pair of plate-like members 82a and 82b. Trailing ends of the paired extensible members 81a and 81b are fixed to the side surface of the inner part of the chamber 10 and the paired plate-like members 82a and 82b are attached to leading ends of the extensible members 81a and 81b, respectively. The paired plate-like members 82a and 82b are formed of, for example, an insulating member such as acrylic.

When the test target object 100 is to be tested using the testing apparatus 2a according to the present modification, the paired extensible members 81a and 81b are in a contracted state as illustrated in FIG. 8A. Meanwhile, when the probes 22 are to be cleaned, the test target object 100 supported on the stage 50 is moved away from the probes 22 in the horizontal direction and the scrap receiving member 62 is placed below the probes 22 as illustrated in FIG. 8B.

Further, the paired extensible members 81a and 81b automatically extend in the horizontal direction between the test target object 100 supported on the stage 50 and the probe card 20. Further, the paired extensible members 81a and 81b vibrate in the vertical direction to rub the paired plate-like members 82a and 82b against each other.

Figure 9A:
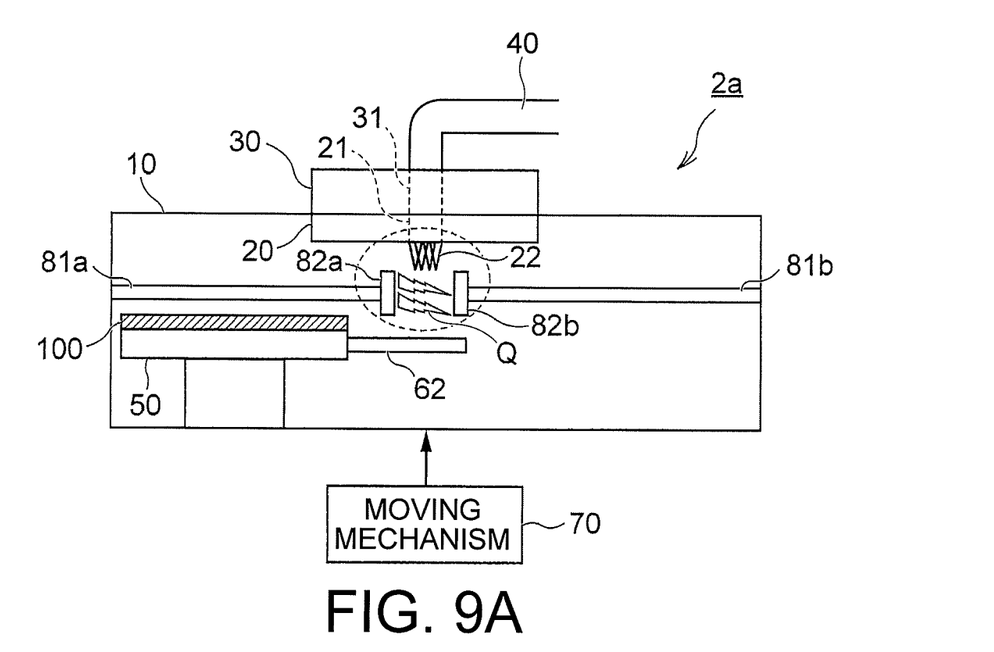
FIG. 9A is a schematic diagram illustrating a cleaning state using the testing apparatus according to the second modification.
Figure 9B:
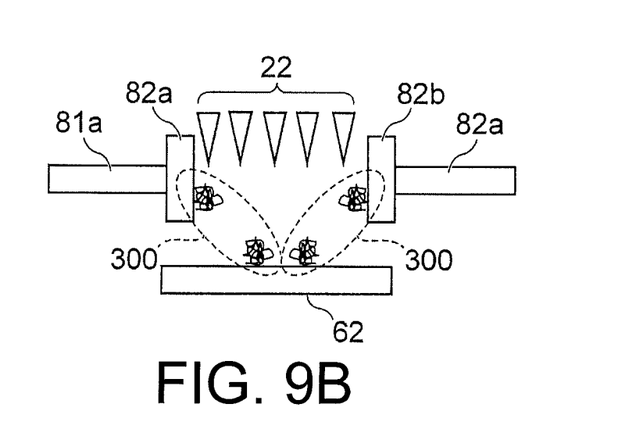
FIG. 9B is an enlarged view of a dotted line region illustrated in FIG. 9A.

FIG. 9A is a schematic diagram illustrating a cleaning state of the probes 22 using the testing apparatus 2a. FIG. 9B is an enlarged view of a dotted line region illustrated in FIG. 9A. When the paired extensible members 81a and 81b are automatically contracted to cause the paired plate-like members 82a and 82b to face each other in the horizontal direction across a space below the probes 22, the static electricity Q is generated in the space below the probes 22 as illustrated in FIG. 9A. As a result, the metal scrap 300 having adhered to the probes 22 is attracted to the static electricity generator 80 or is recovered in the scrap receiving member 62 as illustrated in FIG. 9B.

According to the present modification explained above, the metal scrap 300 having adhered to the probes 22 can be removed with the static electricity Q similarly to the second embodiment. Therefore, reduction in the life of the probes 22 can be avoided while the test accuracy of the test target object 100 is maintained. Furthermore, according to the present modification, the static electricity Q is generated by rubbing the paired plate-like members 82a and 82b against each other. This eliminates the need to output a high voltage and can suppress power consumption of the device.

Third Embodiment

Figure 10A:
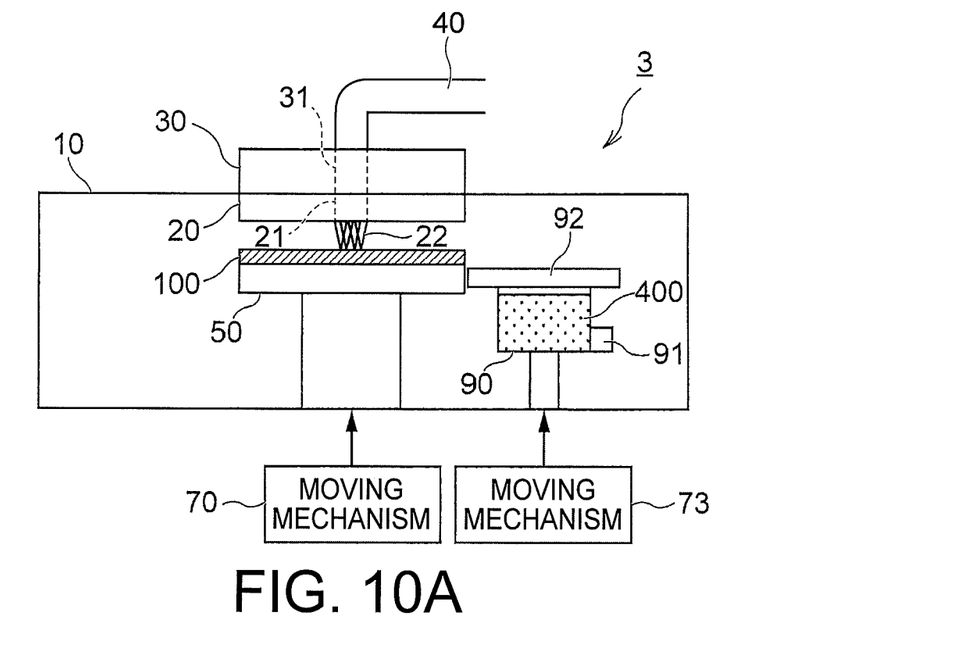
FIG. 10A is a schematic diagram illustrating a testing state using a testing apparatus according to a third embodiment.
Figure 10B:
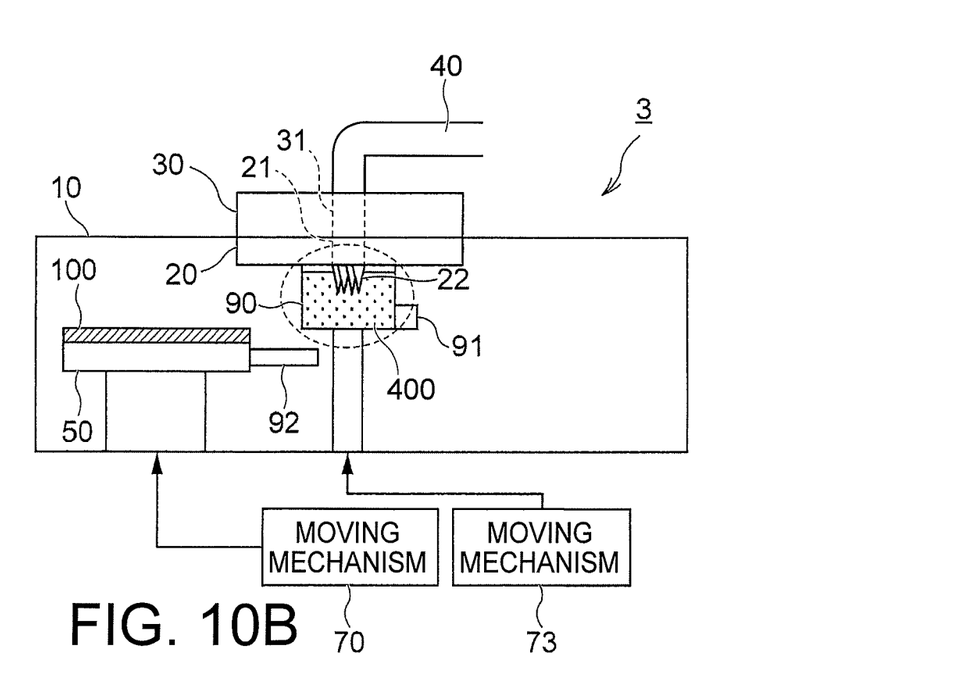
FIG. 10B is a schematic diagram illustrating a cleaning state using the testing apparatus of FIG. 10A.
Figure 11:
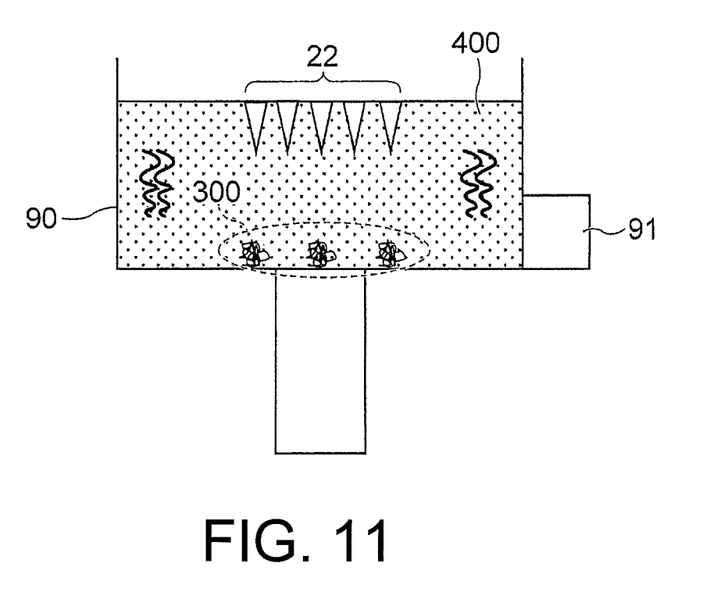
FIG. 11 is an enlarged view of a dotted line region illustrated in FIG. 10B.

FIG. 10A is a schematic diagram illustrating a testing state of the test target object 100 using a testing apparatus 3 according to a third embodiment. FIG. 10B is a schematic diagram illustrating a cleaning state of the probes 22 using the testing apparatus 3. FIG. 11 is an enlarged view of a dotted line region illustrated in FIG. 10B. Constituent elements identical to those of the first embodiment described above are denoted by like reference characters and detailed explanations thereof are omitted.

The testing apparatus 3 according to the present embodiment is different from the testing apparatus 1 according to the first embodiment in including a moving mechanism 73, a container 90, an ultrasonic generator 91, and a lid member 92. The moving mechanism 73 can move the container 90 horizontally and vertically. The container 90 retains a liquid 400 therein. The liquid 400 is a volatile liquid such as alcohol. The ultrasonic generator 91 is installed on the container 90. The ultrasonic generator 91 is constituted by an oscillator or the like that ultrasonically vibrates the liquid 400. The lid member 92 is provided integrally with the stage 50.

When the test target object 100 is to be tested using the testing apparatus 3 according to the present embodiment, a top end opening of the container 90 is covered by the lid member 92 as illustrated in FIG. 10A. Accordingly, the liquid 400 retained in the container 90 can be prevented from scattering in the chamber 10 during the test of the test target object 100.

Meanwhile, when the probes 22 are to be cleaned, the moving mechanism 70 horizontally moves the stage 50 to enable the lid member 92 to open the top end opening of the container 90 as illustrated in FIG. 10B. Next, the moving mechanism 73 moves the container 90 to dip the probes 22 into the liquid 400.

Next, the ultrasonic generator 91 oscillates to ultrasonically vibrate the liquid 400. Vibration of the liquid 400 is transmitted to the probes 22. Accordingly, the probes 22 are cleaned with ultrasound. As a result, the metal scrap 300 having adhered to the probes 22 are removed and settle in the liquid 400 as illustrated in FIG. 11.

After the cleaning of the probes 22 ends, the moving mechanism 73 moves the container 90 downward, so that the probes 22 is arranged away from the liquid 400. At that time, because the liquid 400 is a volatile liquid, the liquid 400 having remained on the probes 22 is likely to evaporate. Therefore, the cleaning time of the probes 22 can be shortened. The probes 22 may be dried using the dry air 200 explained in the first embodiment after the moving mechanism 73 moves the container 90 downward. In this case, the liquid 400 having remained on the probes 22 can be quickly evaporated and therefore the cleaning time can be further shortened.

According to the present embodiment explained above, the metal scrap 300 having adhered to the probes 22 is removed with ultrasound. Accordingly, the metal scrap 300 can be removed without contact of a cleaning member such as a cleaning sheet with the probes 22. This can prevent wear of the probes 22 during cleaning and thus reduction in the life of the probes 22 can be avoided while the test accuracy of the test target object 100 is maintained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A testing apparatus comprising:
   a chamber;
   a probe card comprising probes exposed in the chamber;
   a stage supporting a test target object in the chamber;
   a moving mechanism to move the stage between a testing position where the test target object is in contact with the probes and a cleaning position where the test target object is arranged away from the probes in a horizontal direction; and
   an air tube introducing first dry air into the chamber through the probe card when the stage is placed at the cleaning position, wherein
   the probes are arranged along an opening formed on the probe card, and
   the air tube introduces the first dry air into the chamber through the opening.

2. The testing apparatus according to claim 1, wherein the air tube introduces second dry air into the chamber through the opening of the probe card when the stage is placed at the testing position, and a flow rate of the second dry air is smaller than that of the first dry air.

3. The testing apparatus according to claim 1, further comprising a scrap receiving member provided integrally with the stage or away from the stage, wherein
   the moving mechanism places the scrap receiving member below the probes when the stage is placed at the cleaning position.

4. The testing apparatus according to claim 3, wherein the scrap receiving member includes an adhesive sheet on a surface facing the probes when the stage is placed at the cleaning position.

5. The testing apparatus according to claim 1, further comprising a static electricity generator to generate static electricity below the probes when the stage is placed at the cleaning position.

6. The testing apparatus according to claim 1, further comprising:
   a container retaining a liquid therein where the probes are dipped when the stage is placed at the cleaning position; and
   an ultrasonic generator to ultrasonically vibrate the liquid.

7. The testing apparatus according to claim 6, wherein the liquid is a volatile liquid.

8. The testing apparatus according to claim 6, further comprising a lid member provided integrally with the stage, wherein
   the lid member closes a top end opening of the container when the stage is placed at the testing position and opens the top end opening when the stage is placed at the cleaning position.

9. A testing apparatus comprising:
   a chamber;
   a probe card comprising probes exposed in the chamber;
   a stage supporting a test target object in the chamber;
   a moving mechanism to move the stage between a testing position where the test target object is in contact with the probes and a cleaning position where the test target object is arranged away from the probes in a horizontal direction; and
   a static electricity generator to generate static electricity below the probes when the stage is placed at the cleaning position, wherein
   the static electricity generator comprises a pair of extensible members capable of extending and contracting in the horizontal direction between the test target object supported on the stage and the probe card, and a pair of plate-like members arranged on leading ends of the paired extensible members, respectively, and the paired plate-like members are rubbed against each other to generate the static electricity when the test target object is placed at the cleaning position.

10. The testing apparatus according to claim 9, wherein the static electricity generator is arranged away from the stage in the horizontal direction.

11. The testing apparatus according to claim 9, further comprising a scrap receiving member provided integrally with the stage, wherein the moving mechanism places the scrap receiving member below the probes when the stage is placed at the cleaning position.

12. The testing apparatus according to claim 9, further comprising a test head to discharge the probes after the static electricity generator generates the static electricity.

13. The testing apparatus according to claim 9, further comprising an air tube introducing first dry air into the chamber through the probe card when the stage is placed at the cleaning position, wherein the probes are arranged along an opening formed on the probe card, and the air tube introduces the first dry air into the chamber through the opening.

14. A testing apparatus comprising
a chamber;
a probe card comprising probes exposed in the chamber;
a stage supporting a test target object in the chamber;
a moving mechanism to move the stage between a testing position where the test target object is in contact with the probes and a cleaning position where the test target object is arranged away from the probes in a horizontal direction;
a static electricity generator to generate static electricity below the probes when the stage is placed at the cleaning position; and
a test head to discharge the probes after the static electricity generator generates the static electricity.

15. The testing apparatus according to claim 14, wherein the static electricity generator is arranged away from the stage in the horizontal direction.

16. The testing apparatus according to claim 14, further comprising an air tube introducing first dry air into the chamber through the probe card when the stage is placed at the cleaning position, wherein the probes are arranged along an opening formed on the probe card, and the air tube introduces the first dry air into the chamber through the opening.

\* \* \* \* \*